United States Patent

Nagamoto et al.

[11] Patent Number: 6,139,953
[45] Date of Patent: Oct. 31, 2000

[54] ADHESIVE TAPE, BASE MATERIAL FOR ADHESIVE TAPE AND THEIR MANUFACTURING METHODS

[75] Inventors: Kouichi Nagamoto; Mikio Komiyama; Kazuyoshi Ebe, all of Warabi, Japan

[73] Assignee: Lintec Corporation, Tokyo, Japan

[21] Appl. No.: 08/815,950

[22] Filed: Mar. 13, 1997

[30] Foreign Application Priority Data

Mar. 15, 1996 [JP] Japan ................................. 8-059651

[51] Int. Cl.⁷ ........................................................ C09J 7/02
[52] U.S. Cl. .................. 428/343; 428/345; 428/355 RA; 428/423.1; 428/424.4
[58] Field of Search ..................... 428/343, 345, 428/423.1, 424.4, 355 RA

[56] References Cited

FOREIGN PATENT DOCUMENTS

| | | |
|---|---|---|
| 0522 251 A2 | 1/1993 | European Pat. Off. . |
| 63-153814 | 6/1986 | Japan . |
| 62-153376 | 7/1987 | Japan . |
| 2 194 951 | 3/1988 | United Kingdom . |

*Primary Examiner*—Jenna Davis
*Attorney, Agent, or Firm*—Finnegan, Henderson, Farabow, Garrett & Dunner, L.L.P.

[57] ABSTRACT

A base material has a radiation-cured material prepared by curing a mixture of urethane acrylate oligomer and reactive dilute monomer, and also it shows a breaking elongation of more than 10%, preferably of more than 100%. The base material is used as a base sheet of an adhesive tape where an adhesive layer is formed on the base sheet. Accordingly, the novel base material and its manufacturing method in addition to an adhesive tape having such base material are provided. Furthermore, the adhesive tape has a flat surface without any fish-eye that causes the troubles of cracking, chip-scattering, and so on in the steps of back-grinding and dicing of the semiconductor wafer, and also the adhesive tape can be processed so as to have a predetermined thickness with high accuracy, compared with that of the conventional one.

27 Claims, 2 Drawing Sheets

ADHESIVE TAPE, BASE MATERIAL FOR ADHESIVE TAPE AND THEIR MANUFACTURING METHODS

BACKGROUND OF THE INVENTION

1. Field of the Invention

The present invention relates to a base structure of an adhesive tape to be used for precision-machining of an optical structural element such as a lens, a semiconductor structural element such as a wafer, or the like. The present invention also relates to a method of manufacturing the above base structure and an adhesive tape having the base structure on which an adhesive layer is formed.

2. Description of the Prior Art

Heretofore, adhesive tapes have been used in the fields of optical industry, semiconductor industry, and so on, for manufacturing structural elements that require precision-machining. In the following description, as a concrete example of the conventional one, we will explain an adhesive tape used in the field of manufacturing a semiconductor wafer.

Generally, the adhesive tape can be prepared by the process including the steps of: melting a thermoplastic resin; forming a film-shaped base structure as a base sheet by subjecting the melted thermoplastic resin into the process of using a T-die, a blow-extrusion, a calender, or the like; and applying an adhesive agent on at least one surface of the base sheet. The adhesive tape thus obtained is typically used for holding a semiconductor wafer in place during the step of grinding the wafer's back and also the step of dicing and isolating the wafer.

At first, we will explain the example of using the adhesive tape in the process of grinding a back side of a semiconductor wafer that has a front side on which a predetermined pattern is formed.

At the time of grinding the back side of the wafer, the wafer's back is continuously rinsed by running pure water to remove scattered or fragmented remains (i.e., debris) and to reduce heat generated by the grinding. In this case, therefore, an adhesive tape is applied on the wafer's front to protect the pattern formed thereon from the grinding.

At the time of performing the step of dicing the semiconductor wafer into pieces, an adhesive tape is applied on the wafer's back, so that the wafer on which the adhesive tape is being adhered is subjected into each of the steps of dicing, washing, drying, expanding, pick-upping, and mounting, successively.

These steps requires that the adhesive tape should have the properties of, for example without remaining any part of the adhesive agent on a wafer or a chip when the adhesive tape is removed after processing. For solving this problem, several improvements have been disclosed in patent documents including Japanese Patent Application Laying-open No. 62-153376 (1987) and Japanese Patent Application Publication No. 5-77284 (1993).

An adhesive sheet disclosed in Japanese Patent Application Laying-open No. 62-153376 (1987) comprises an adhesive containing urethane acrylate (m.w. 3,000–10,000) as a radiation-induced polymerized compound applied on a base material. Therefore, an adhesive strength of the adhesive sheet is sufficiently decreased by an effect of irradiating with ultraviolet rays or the like in the step of pick-upping after dicing the semiconductor wafer, as that the adhesive agent does not remain on the back of the wafer chip. On the other hand, an adhesive tape disclosed in Japanese Patent Application Publication No. 5-77284 (1993) comprises a water-swelling type adhesive agent as an adhesive layer applied on a surface of a base sheet. In this case, therefore, it becomes to possible to remove the adhesive agent attached on the wafer's surface by running water after the grinding process.

Each of the adhesive tapes described above uses the base material prepared as a film-shaped material by melting a thermoplastic resin such as vinyl chloride or polypropylene and subjecting the melted thermoplastic resin into the process of using a T-die, a blow-extrusion, a calender, or the like, so that the conventional adhesive tapes have the following disadvantages which should be resolved by the present invention. That is, several small projections are sparsely formed on a surface of the base sheet as a result of mixing undesired foreign particles, insoluble portions of the resin components, or the like into the resin at the time of forming the film-shaped base material. Each of those projections are in the shape of a fish's eye with a height of about 10 to 50 $\mu$m (hereinafter the projection is referred as a fish-eye). These fish-eyes cause several disadvantages as described in the follows.

FIGS. 1 and 2 are schematic cross sectional views of a semiconductor wafer supported by a conventional adhesive tape. FIG. 1 illustrates the step of grinding a back side of the semiconductor wafer, while FIG. 2 illustrates the step of dicing the semiconductor wafer.

An adhesive tape 10 comprises a base sheet 11 and an adhesive layer 12 applied on the base sheet 11. As shown in the figures, the adhesive tape 10 is being adhered to a surface 14 (where a pattern is formed) of a semiconductor wafer 13. In the step of grinding, a back side of the semiconductor wafer 13 is subjected to a grinding machine (not shown). In this case, however, the back side's surface receives uneven pressure from the grinding machine because of the existence of the above fish-eyes thereon. That is, there is the pressure difference between a portion having a fish-eye and an intact portion of the back side and it results in cracks to be extended from the fish-eye on the semiconductor wafer. In the step of dicing the semiconductor wafer 13, furthermore, the adhesive tape 10 is being adhered to the back side of the semiconductor wafer to be diced into chips from the front side thereof. During the dicing, uniform pressure is being applied from the back to the front of the wafer. In this case, however, there is the pressure difference between a portion having a fish-eye and an intact portion of the back side and it results in flying a chip off when the wafer is diced.

For solving these disadvantages, there is the attempt to eliminate the fish-eyes forcefully by pressing the base material by a mold component in the conventional process of preparing the adhesive tape. However, this attempt is not a fundamental problem-solving technique and requires an additional step, so that it leads to confuse its manufacturing process and to increase a production cost of the adhesive tape.

SUMMARY OF THE INVENTION

Accordingly, it is an object of the present invention to provide a base material to be applied for an adhesive tape, having a flat surface with an extremely less thickness variation compared with that of the conventional one.

It is another object of the present invention to provide a method for preparing a base material to be applied for an adhesive tape, having a flat surface with an extremely less thickness variation compared with that of the conventional one.

It is a further object of the present invention to prove an adhesive tape comprising a base material on which an adhesive layer is provided, where the adhesive tape has a flat surface with an extremely less thickness variation compared with that of the conventional one.

In a first aspect of the present invention, there is provided a base material to be used as a base sheet of an adhesive tape having an adhesive layer formed on the base sheet, comprising:

a radiation-cured material prepared by curing a mixture of urethane acrylate oligomer and reactive dilute monomer, having a breaking elongation of more than 10%, preferably of more than 100%.

Here, an initial elastic coefficient of the radiation-cured material may be from 100 to 100,000 kg/cm$^2$, preferably from 500 to 50,000 kg/cm$^2$.

The urethane acrylate ligomer may have a molecular weight of from 500 to 100,000, preferably from 1,000 to 30,000 and may be 2-functional urethane acrylate having ester diol as a main skeleton.

The reactive dilute monomer may be at least one selected from a group of morpholine acrylate, isobornyl (meth) acrylate, dicyclopentanyl (meth) acrylate, dicyclopentenyl (meth) acrylate, and methoxylated cyclodecatriene acrylate.

A mixing ratio between the urethane acrylate oligomer and the reactive dilute monomer may be 95 to 5:5 to 95, preferably 50 to 70:50 to 30.

IN a second aspect of the present invention, there is provided a method of manufacturing a base material to be used as a base sheet of an adhesive tape having an adhesive layer formed on the base sheet, comprising steps of:

preparing a mixture of urethane acrylate oligomer and reactive dilute monomer; and irradiating the mixture with a radiation to obtain a radiation-cured material as a base material, wherein the radiation-cured material has a breaking elongation of more than 10%, preferably of more than 100%.

Here, an initial elastic coefficient of the radiation-cured material may be from 100 to 100,000 kg/cm$^2$, preferably from 500 to 50,000, kg/cm$^2$.

The urethane acrylate oligomer may have a molecular weight of from 500 to 100,000, preferably from 1,000 to 30,000 and may be 2-functional urethane acrylate having ester diol as a main skeleton.

The reactive dilute monomer may be at least one selected from a group of morpholine acrylate, isobornyl (meth) acrylate, dicyclopentanyl (meth) acrylate, dicyclopentenyl (meth) acrylate, and methoxylated cyclodecatriene acrylate.

A mixing ratio between the urethane acrylate oligomer and the reactive dilute monomer may be 95 to 5:5 to 95, preferably 50 to 70:50 to 30.

In a third aspect of the present invention, there is provided an adhesive tape having an adhesive layer formed on at least one surface of a base sheet, wherein The base sheet comprising:

a radiation-cured material prepared by curing a mixture of urethane acrylate oligomer and reactive dilute monomer, having a breaking elongation of more than 50%, preferably of more than 100%.

Here, an initial elastic coefficient of the radiation-cured material may be from 100 to 100,000 kg/cm$^2$, preferably from 500 to 50,000 kg/cm$^2$.

the urethane acrylate oligomer may have a molecular weight of from 500 to 100,000, preferably from 1,000 to 30,000 and may be 2-functional urethane acrylate having ester diol as a main skeleton.

The reactive dilute monomer may be one selected from a group of morpholine acrylate, isobornyl (meth) acrylate, dicyclopentanyl (meth) acrylate, dicyclopentenyl (meth) acrylate, and methoxylated cyclodecatriene acrylate.

A mixing ratio between the urethane acrylate oligomer and the reactive dilute monomer may be 95 to 5:5 to 95, preferably 50 to 70:50 to 30.

The adhesive layer may consist of a removable adhesive agent.

The above and other objects, effects, features, and advantages of the present invention will become more apparent from the following description of embodiments thereof taken in conjunction with accompanying drawings.

DETAILED DESCRIPTION OF PREFERRED EMBODIMENTS

Figure 1:
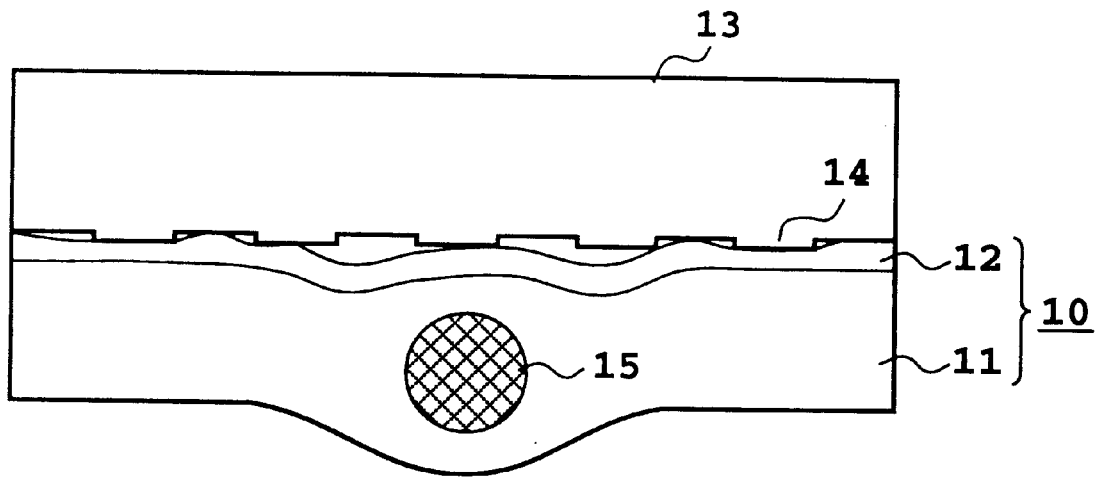
FIG. 1 is a schematic cross sectional view of a semiconductor wafer supported by a conventional adhesive tape for illustrating the step of grinding a back side of the semiconductor wafer.
Figure 2:
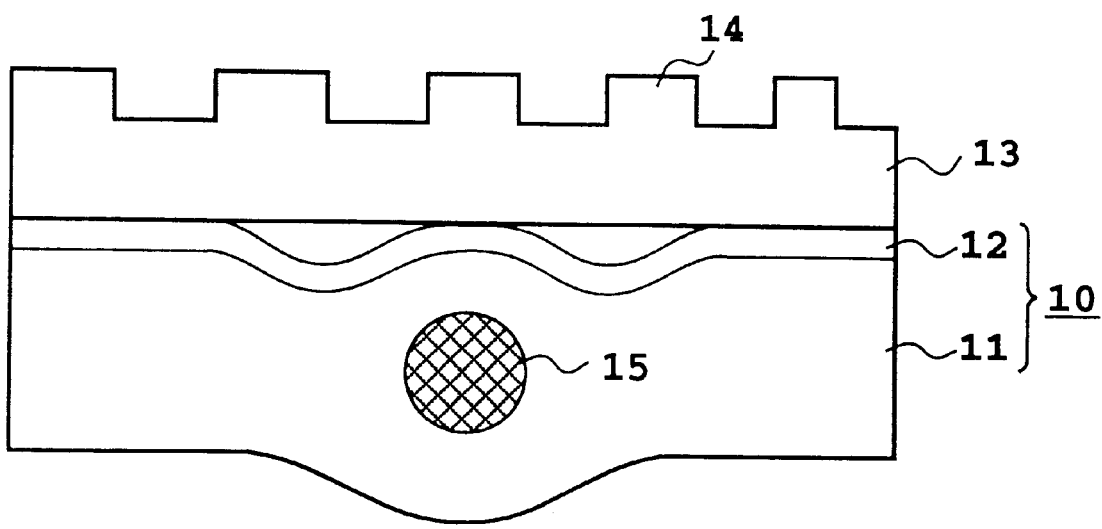
FIG. 2 is a schematic cross sectional view of a semiconductor wafer supported by a conventional adhesive tape for illustrating the step of dicing the semiconductor wafer.
Figure 3:
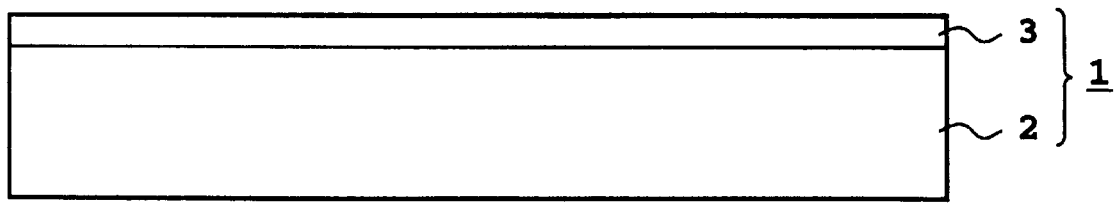
FIG. 3 is a cross sectional view of an adhesive tape as one of embodiments of the present invention.

Referring now to FIG. 3, we will describe an adhesive tape as one of embodiments of the present invention.

Figure 4:
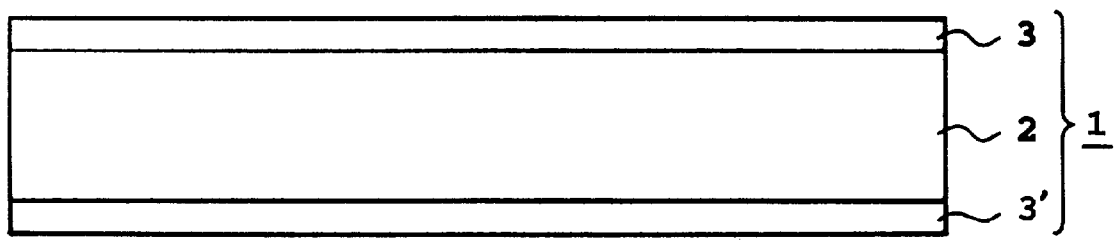
FIG. 4 is a cross sectional view of an adhesive tape as another embodiment of the present invention.

The adhesive tape 1 comprises a base sheet 2 and an adhesive layer 3 laminated on the base sheet 2. As shown in the figure, the adhesive layer 3 is only provided on one side of the base sheet 2. Depending on its uses, as shown in FIG. 4, the adhesive layers 3, 3', may be provided on both sides of the base sheet 2. In this case, these adhesive layers 3, 3' may be of different adhesive strength.

The base sheet 2 is in the shape of a film prepared by the process including the steps of:

(i) preparing a liquid resin by blending an urethane acrylate oligomer, a reactive dilute monomer, and a photoinitiating agent, where a pigment such as phthalocyanine may be further comprised in the resin if required;

(ii) forming the liquid resin successively into a film-shaped one using a T-die or the like (i.e., casting step); and (iii) irradiating the resin film with a radiation, for example ultraviolet rays (UV) or electron beams (EB) to cure the resin film to obtain a film-shaped base sheet (i.e., curing step).

Prior to the step of casting the above liquid resin, foreign or insoluble substances may be removed by filtering the liquid resin.

Consequently, we obtain an adhesive tape that has a flat surface without any fish-eye and with an extremely less thickness variation compared with that of the conventional one.

In this embodiment, furthermore, the base sheet 2 is of having a breaking elongation of 10% or more, preferably of 100% or more, and an initial elastic coefficient of 100 to 100,000 kg/cm$^2$, preferably of 500 to 50,000 kg/cm$^2$. If the initial elastic coefficient is less than 100 kg/cm$^2$, the cured resin is too flexible to be formed as a film. If it is over than 100,000 kg/cm$^2$, the cured resin is too hard to an adherence of the adhesive tape. It means that the adhesive tape having an appropriate flexibility can be obtained if the base material has the above appropriate physical properties.

In this embodiment, the above urethane acrylate oligomer is a two-functional urethane acrylate having an ester diol as its main skeleton and having a molecular weight of 500 to 100,000, preferably of 1,000 to 30,000. On the other hand, the reactive dilute monomer can be selected from the group of morpholine acrylate, isobornyl (meth) acrylate, dicyclopentanyl (meth) acrylate dicyclopentenyl (meth) acrylate, methoxylated cyclodecatriene acrylate and so on.

A mixing ratio between the urethane acrylate oligomer and the reactive dilute monomer is 95 to 5:5 to 95, preferably 50 to 70:50 to 30. If the amount of the urethane acrylate oligomer exceeds that of the mixing ratio, a viscosity of the resin becomes too high for the above step of film formation.

In this embodiment, the adhesive layer 3 consists of a removable adhesive agent, for example an acrylate polymer, a synthetic rubber, and a natural rubber, or an adhesive agent disclosed in the aforementioned Japanese Patent Application Laying-open No. 62-153376 (1987) or Japanese Patent Application Publication No. 5-77284 (1993).

In the following description, we will also explain a method of manufacturing a base sheet for an adhesive tape as one of the embodiments of the present invention.

According to the present invention, the method mainly comprises the steps of: preparing a blended composition containing an urethane acrylate oligomer and a reactive dilute monomer; and irradiating the blended composition with a radiation to cure the blended composition to obtain a product having a breaking elongation of 10% or more, preferably of 100% or more. The above blended composition may optionally include a photo-initiator. In this method, furthermore, the blended composition may be provided as a liquid resin to be successively formed into a film-shaped one to be cured by an irradiation of UV or EB for obtaining a cured film-shaped product as a base sheet of the present invention. It is preferable that an initial elastic coefficient of the radiation-cured material is 100 to 100,000 kg/cm$^2$; preferably 500 to 50,000 kg/cm$^2$.

EXAMPLE 1

A base sheet for an adhesive tape was prepared as follows.

Firstly, a liquid resin ($\eta$ 5,000 cps, 25° C.) was prepared by mixing:

60 parts of 2-functional urethane acrylate having an ester diol as its main skeleton (trade name; UX3301 (m.w.: 8000), manufactured by Nippon Kayaku Co., Ltd.);

40 parts of morpholine acrylate (trade name: ACMO, manufactured by Kojin Co., Ltd.); and 4 parts of 1-hydroxy-cyclohexyl-phenyl-ketone (trade name: Irgacure 184, manufactured by Ciba Specialty Chemicals K.K.) as a photo-intitiator.

Secondly, the liquid resin was applied on a PET film (i.e., a support film of 38 $\mu$m in thickness) by means of a fountain die technique to make a resin layer of 100 $\mu$m in thickness, and subsequently cured by irradiating the liquid resin with ultraviolet rays. In this example, the liquid resin formed on the PET film was positioned at a distance of 15 cm from an UV source. The UV source comprises a high-pressure mercury lamp for UV radiation with a light quantity of 250 mJ/cm$^2$ at 120 W/cm power. Consequently, a base sheet for an adhesive tape according to the present invention was obtained.

EXAMPLE 2

A base sheet for an adhesive tape was prepared by the same way as that of Example 1 with the exception of the follows. That is, the base sheet of the present example was prepared without using the photo-initiator under the curing condition different from that of Example 1. In this example, the liquid resin was cured by radiation of electron beams with a dose of 15 K Gray at an accelerating voltage of 200 KeV.

A base sheet for an adhesive tape was prepared by the same way as that of Example 1 with the exception of using a comma coater system instead of the fountain die system.

COMPARATIVE EXAMPLE 1 a base sheet of 100 $\mu$m in thickness was prepared from LDPE using a T-die method.

COMPARATIVE EXAMPLE 2

A base sheet of 100 $\mu$m in thickness was prepared from ethylene-methacrylate copolymer (EMMA) using a calender method.

Evaluations of Examples 1–3 and Comparative Examples 1 and 2

Each of the base sheets obtained in Examples 1–3 and Comparative Examples 1 and 2 were evaluated with respect to the presence of fish-eyes on its surface and accuracy in thickness of the base sheet. The results were listed in Table 1.

TABLE 1

|  | The number of the fish-eyes per 10 m$^2$ | Accuracy in thickness ($\pm \mu$m) |
| --- | --- | --- |
| Example 1 | 0 | 3 |
| Example 2 | 0 | 3 |
| Example 3 | 0 | 3 |
| Comparative Example 1 | 50–100 | 8 |
| Comparative Example 2 | 10–50 | 5 |

In the table, a visually-detectable projected portion of over 20 $\mu$m in height was defined as a fish-eye.

Then, adhesive tapes were prepared using the above base sheets of Examples 1–3 and Comparative Examples 1 and 2, respectively. In each adhesive tape, an acrylic adhesive agent was applied on the base sheet to form an adhesive layer of 20 $\mu$m in thickness.

The adhesive tapes were used in the steps of back-grinding and dicing of silicon wafers. In the case of using the adhesive tape of Example 1, 2, or 3, there was no troubles in each of these steps. In the case of using the adhesive tape of Comparative Example 1 or 2, on the other hand, the semiconductor wafer was cracked radially from the fish-eye in the above step of back-grinding while chips were scattered at random over the surface of the semiconductor wafer from the fish-eye in the above step of dicing.

Consequently, the base sheets of Examples 1, 2, and 3 did not have any fish-eye, so that they did not cause any troubles of cracking, chip-scattering, and so on in the steps of back-grinding and dicing of the semiconductor wafer.

In accordance with the present invention, as described above, it becomes possible to provide a base sheet for an adhesive tape, an adhesive tape using such base sheet, and a method of manufacturing the base sheet, which can be used in the process of manufacturing a structural component to be subjected to an ultra-micromachining in the field of optical industry, semiconductor industry, or the like. According to the present invention, furthermore, the adhesive tape has a flat surface without any fish-eye that causes the troubles of cracking, chip-scattering, and so on in the steps of back-grinding and dicing of the semiconductor wafer, and also the adhesive tape can be processed so as to have a predetermined thickness with high accuracy, compared with that of the conventional one.

The present invention has been described in detail with respect to various embodiments, and it will now be apparent from the foregoing to those skilled in the art that changes and modifications may be made without deviating from the invention in its broader aspects, and it is the intention, therefore, in the appended claims to cover all such changes and modifications as fall within the true spirit of the invention.

What is claimed is:

1. A base material to be used as a base sheet of an adhesive tape having an adhesive layer formed on said base sheet, said base material comprising:
   a radiation-cured material comprising mixture of a urethane acrylate oligomer and a reactive dilute monomer, wherein said radiation-cured material has a breaking elongation of more than 10% and said reactive dilute monomer is at least one selected from the group consisting of morpholine acrylate, isobornyl (meth) acrylate, dicyclopentanyl (meth) acrylate, dicyclopentenyl (meth) acrylate, and methoxylated cyclodecatriene acrylate.

2. A base material as claimed in claim 1, wherein
   an initial elastic coefficient of said radiation-cured material is from 100 to 100,000 kg/cm$^2$.

3. A base material as claimed in claim 1, wherein
   said urethane acrylate oligomer has a molecular weight of from 500 to 100,000 and is 2-functional urethane acrylate having ester diol as a main skeleton.

4. A base material as claimed in claim 1, wherein
   a mixing ratio between said urethane acrylate oligomer and said reactive dilute monomer is 95 to 5:5 to 95.

5. A base material as claimed in claim 1, wherein
   said adhesive layer consists of a removable adhesive agent.

6. A base material as claimed in claim 1, wherein said radiation-cured material has a breaking elongation of more than 100%.

7. A base material as claimed in claim 2, wherein the initial elastic coefficient is from 500 to 50,000 kg/cm$^2$.

8. A base material as claimed in claim 3, wherein said urethane acrylate oligomer has a molecular weight of from 1,000 to 30,000.

9. A base material as claimed in claim 4, wherein the mixing ration is 50 to 70:50 to 30.

10. A method of manufacturing a base material to be used as a base sheet of an adhesive tape having an adhesive layer formed on said base sheet, comprising the steps of:
    1) preparing a mixture of urethane acrylate oligomer and reactive dilute monomer, wherein, said reactive dilute monomer is at least one
       selected from the group consisting of morpholine acrylate, isobornyl (meth) acrylate, dicyclopentanyl (meth) acrylate, dicyclopentenyl (meth) acrylate, and methoxylated cyclodecatriene acrylate; and
    2) irradiating said mixture with a radiation to obtain a radiation-cured material as a base material, wherein, said radiation-cured material has a breaking elongation of more than 10%.

11. A method as claimed in claim 10, wherein
    an initial elastic coefficient of said radiation-cured material is from 100 to 100,000 kg/cm$^2$.

12. A method as claimed in claim 10, wherein
    said urethane acrylate oligomer has a molecular weight of from 500 to 100,000 and is 2-functional urethane acrylate having ester diol as a main skeleton.

13. A method as claimed in claim 10, wherein
    a mixing ratio between a said urethane acrylate oligomer and said reactive dilute monomer is 95 to 5:5 to 95.

14. A method as claimed in claim 10, wherein
    said adhesive layer consists of a removable adhesive agent.

15. A method as claimed in claim 10, wherein said radiation-cured material has a breaking elongation of more than 100%.

16. A method as claimed in claim 11, wherein the initial elastic coefficient is from 500 to 50,000 kg/cm$^2$.

17. A method as claimed in claim 12, wherein said urethane acrylate oligomer has a molecular weight of from 1,000 to 30,000.

18. A method as claimed in claim 13, wherein the mixing ratio is 50 to 70:50 to 30.

19. An adhesive tape having an adhesive layer formed on at least one surface of a base sheet, said base sheet comprising:
    a radiation-cured material comprising mixture of a urethane acrylate oligomer and a reactive dilute monomer, wherein said radiation-cured material has a breaking elongation of more than 10% and said reactive dilute monomer is at least one selected from the group consisting of morpholine acrylate, isobornyl (meth) acrylate, dicyclopentanyl (meth) acrylate, dicyclopentenyl (meth) acrylate, and methoxylated cyclodecatriene acrylate.

20. An adhesive tape as claimed in claim 19, wherein
    an initial elastic coefficient of said radiation-cured material is from 100 to 100,000 kg/cm$^2$.

21. An adhesive tape as claimed in claim 19, wherein
    said urethane acrylate oligomer has a molecular weight of from 500 to 100,000 and is 2-functional urethane acrylate having ester diol as a main skeleton.

22. An adhesive tape as claimed in claim 19, wherein
    a mixing ratio between said urethane acrylate oligomer and said reactive dilute monomer is 95 to 5:5 to 95.

23. An adhesive tape as claimed in claim 19, wherein
    said adhesive layer consists of a removable adhesive agent.

24. An adhesive tape as claimed in claim 19, wherein said radiation-cured material has a breaking elongation of more than 100%.

25. An adhesive tape as claimed in claim 20, wherein the initial elastic coefficient is from 500 to 50,000 kg/cm$^2$.

26. An adhesive tape as claimed in claim 21, wherein said urethane acrylate oligomer has a molecular weight of from 1,000 to 30,000.

27. An adhesive tape as claimed in claim 22, wherein the mixing ratio is 50 to 70:50 to 30.

* * * * *